(12) United States Patent
Co et al.

(10) Patent No.: US 9,530,749 B2
(45) Date of Patent: Dec. 27, 2016

(54) COUPLING OF SIDE SURFACE CONTACTS TO A CIRCUIT PLATFORM

(71) Applicant: Invensas Corporation, San Jose, CA (US)

(72) Inventors: Reynaldo Co, Santa Cruz, CA (US); Willmar Subido, Garland, TX (US); Hoang Nguyen, Santa Cruz, CA (US); Marjorie Cara, Tracy, CA (US); Wael Zohni, San Jose, CA (US); Christopher W. Lattin, San Jose, CA (US)

(73) Assignee: Invensas Corporation, San Jose, CA (US)

( * ) Notice: Subject to any disclaimer, the term of this patent is extended or adjusted under 35 U.S.C. 154(b) by 0 days.

(21) Appl. No.: 14/698,684

(22) Filed: Apr. 28, 2015

(65) Prior Publication Data
US 2016/0322325 A1    Nov. 3, 2016

(51) Int. Cl.
| | |
|---|---|
| H01L 23/02 | (2006.01) |
| H01L 23/48 | (2006.01) |
| H01L 23/52 | (2006.01) |
| H01L 29/40 | (2006.01) |
| H01L 21/44 | (2006.01) |

(Continued)

(52) U.S. Cl.
CPC ............ *H01L 24/49* (2013.01); *B23K 20/004* (2013.01); *B81B 7/007* (2013.01); *B81C 1/00301* (2013.01); *H01L 24/85* (2013.01); *B81B 2207/05* (2013.01); *H01L 2224/48106* (2013.01); *H01L 2224/48227* (2013.01); *H01L 2224/4903* (2013.01); *H01L 2224/85203* (2013.01); *H01L 2924/1461* (2013.01)

(58) Field of Classification Search
CPC .......... H01L 24/49; H01L 24/85; B81B 7/007
USPC .......... 257/686, 784; 438/109, 112; 361/803
See application file for complete search history.

(56) References Cited

U.S. PATENT DOCUMENTS

| | | |
|---|---|---|
| 3,289,452 A | 12/1966 | Koellner |
| 3,358,897 A | 12/1967 | Christensen |

(Continued)

FOREIGN PATENT DOCUMENTS

| | | |
|---|---|---|
| JP | 61125062 A | 6/1986 |
| JP | 11251350 A | 9/1999 |

(Continued)

OTHER PUBLICATIONS

Meiser S, "Klein Und Komplex", Elektronik, IRL Press Limited, DE, vol. 41, No. 1, Jan. 7, 1992, pp. 72-77, XP000277326. (International Search Report for Application No. PCT/US2012/060402 dated Feb. 21, 2013 provides concise statement of relevance.).

(Continued)

*Primary Examiner* — David S Blum

(57) ABSTRACT

An apparatus relates generally to a microelectromechanical system component. In such an apparatus, the microelectromechanical system component has a lower surface, an upper surface, first side surfaces, and second side surfaces. Surface area of the first side surfaces is greater than surface area of the second side surfaces. The microelectromechanical system component has a plurality of wire bond wires attached to and extending away from a first side surface of the first side surfaces. The wire bond wires are self-supporting and cantilevered with respect to the first side surface of the first side surfaces.

13 Claims, 14 Drawing Sheets

(51) Int. Cl.
  *H01L 21/48*  (2006.01)
  *H01L 21/50*  (2006.01)
  *H05K 1/11*  (2006.01)
  *H05K 1/14*  (2006.01)
  *H01L 23/00*  (2006.01)
  *B81B 7/00*  (2006.01)
  *B81C 1/00*  (2006.01)
  *B23K 20/00*  (2006.01)

(56) References Cited

U.S. PATENT DOCUMENTS

| | | |
|---|---|---|
| 4,771,930 A | 9/1988 | Gillotti et al. |
| 4,998,885 A | 3/1991 | Beaman |
| 4,999,472 A | 3/1991 | Neinast et al. |
| 5,067,382 A | 11/1991 | Zimmerman et al. |
| 5,095,187 A | 3/1992 | Gliga |
| 5,371,654 A | 12/1994 | Beaman et al. |
| 5,531,022 A | 7/1996 | Beaman et al. |
| 5,541,567 A | 7/1996 | Fogel et al. |
| 5,571,428 A | 11/1996 | Nishimura et al. |
| 5,608,265 A | 3/1997 | Kitano et al. |
| 5,635,846 A | 6/1997 | Beaman et al. |
| 5,726,493 A | 3/1998 | Yamashita et al. |
| 5,821,763 A | 10/1998 | Beaman et al. |
| 5,898,991 A | 5/1999 | Fogel et al. |
| 5,953,624 A | 9/1999 | Bando et al. |
| 5,994,152 A | 11/1999 | Khandros et al. |
| 6,054,337 A | 4/2000 | Solberg |
| 6,164,523 A | 12/2000 | Fauty et al. |
| 6,206,273 B1 | 3/2001 | Beaman et al. |
| 6,295,729 B1 | 10/2001 | Beaman et al. |
| 6,300,780 B1 | 10/2001 | Beaman et al. |
| 6,334,247 B1 | 1/2002 | Beaman et al. |
| 6,476,503 B1 | 11/2002 | Imamura et al. |
| 6,476,583 B2 | 11/2002 | McAndrews |
| 6,509,639 B1 | 1/2003 | Lin |
| 6,526,655 B2 | 3/2003 | Beaman et al. |
| 6,581,283 B2 | 6/2003 | Sugiura et al. |
| 6,687,988 B1 | 2/2004 | Sugiura et al. |
| 6,708,403 B2 | 3/2004 | Beaman et al. |
| 6,734,542 B2 | 5/2004 | Nakatani et al. |
| 6,765,287 B1 | 7/2004 | Lin |
| 6,774,467 B2 | 8/2004 | Horiuchi et al. |
| 6,790,757 B1 | 9/2004 | Chittipeddi et al. |
| 6,933,608 B2 | 8/2005 | Fujisawa |
| 6,946,380 B2 | 9/2005 | Takahashi |
| 6,962,864 B1 | 11/2005 | Jeng et al. |
| 7,009,297 B1 | 3/2006 | Chiang et al. |
| 7,176,506 B2 | 2/2007 | Beroz et al. |
| 7,227,095 B2 | 6/2007 | Roberts et al. |
| 7,229,906 B2 | 6/2007 | Babinetz et al. |
| 7,242,081 B1 | 7/2007 | Lee |
| 7,262,124 B2 | 8/2007 | Fujisawa |
| 7,344,917 B2 | 3/2008 | Gautham |
| 7,371,676 B2 | 5/2008 | Hembree |
| 7,391,121 B2 | 6/2008 | Otremba |
| 7,456,091 B2 | 11/2008 | Kuraya et al. |
| 7,476,608 B2 | 1/2009 | Craig et al. |
| 7,495,342 B2 | 2/2009 | Beaman et al. |
| 7,538,565 B1 | 5/2009 | Beaman et al. |
| 7,550,836 B2 | 6/2009 | Chou et al. |
| 7,576,439 B2 | 8/2009 | Craig et al. |
| 7,578,422 B2 | 8/2009 | Lange et al. |
| 7,621,436 B2 | 11/2009 | Mii et al. |
| 7,642,133 B2 | 1/2010 | Wu et al. |
| 7,682,962 B2 | 3/2010 | Hembree |
| 7,728,443 B2 | 6/2010 | Hembree |
| 7,757,385 B2 | 7/2010 | Hembree |
| 7,795,717 B2 | 9/2010 | Goller |
| 7,855,462 B2 | 12/2010 | Boon et al. |
| 7,892,889 B2 | 2/2011 | Howard et al. |
| 7,919,846 B2 | 4/2011 | Hembree |
| 7,932,170 B1 | 4/2011 | Huemoeller et al. |
| 7,977,597 B2 | 7/2011 | Roberts et al. |
| 8,020,290 B2 | 9/2011 | Sheats |
| 8,217,502 B2 | 7/2012 | Ko |
| 8,304,900 B2 | 11/2012 | Jang et al. |
| 8,372,741 B1 | 2/2013 | Co et al. |
| 8,772,152 B2 | 7/2014 | Co et al. |
| 2001/0002607 A1 | 6/2001 | Sugiura et al. |
| 2001/0021541 A1 | 9/2001 | Akram et al. |
| 2002/0014004 A1 | 2/2002 | Beaman et al. |
| 2002/0117330 A1 | 8/2002 | Eldridge et al. |
| 2002/0185735 A1 | 12/2002 | Sakurai et al. |
| 2003/0048108 A1 | 3/2003 | Beaman et al. |
| 2003/0106213 A1 | 6/2003 | Beaman et al. |
| 2003/0162378 A1 | 8/2003 | Mikami |
| 2004/0148773 A1 | 8/2004 | Beaman et al. |
| 2004/0152292 A1 | 8/2004 | Babinetz et al. |
| 2004/0188499 A1 | 9/2004 | Nosaka |
| 2005/0062492 A1 | 3/2005 | Beaman et al. |
| 2005/0095835 A1 | 5/2005 | Humpston et al. |
| 2005/0121764 A1 | 6/2005 | Mallik et al. |
| 2005/0173807 A1 | 8/2005 | Zhu et al. |
| 2005/0212109 A1 | 9/2005 | Cherukuri et al. |
| 2005/0266672 A1 | 12/2005 | Jeng et al. |
| 2006/0278682 A1 | 12/2006 | Lange et al. |
| 2007/0015353 A1 | 1/2007 | Craig et al. |
| 2007/0271781 A9 | 11/2007 | Beaman et al. |
| 2008/0047741 A1 | 2/2008 | Beaman et al. |
| 2008/0048690 A1 | 2/2008 | Beaman et al. |
| 2008/0048691 A1 | 2/2008 | Beaman et al. |
| 2008/0048697 A1 | 2/2008 | Beaman et al. |
| 2008/0073769 A1 | 3/2008 | Wu et al. |
| 2008/0076208 A1 | 3/2008 | Wu et al. |
| 2008/0100316 A1 | 5/2008 | Beaman et al. |
| 2008/0100317 A1 | 5/2008 | Beaman et al. |
| 2008/0100318 A1 | 5/2008 | Beaman et al. |
| 2008/0100324 A1 | 5/2008 | Beaman et al. |
| 2008/0106281 A1 | 5/2008 | Beaman et al. |
| 2008/0106282 A1 | 5/2008 | Beaman et al. |
| 2008/0106283 A1 | 5/2008 | Beaman et al. |
| 2008/0106284 A1 | 5/2008 | Beaman et al. |
| 2008/0106285 A1 | 5/2008 | Beaman et al. |
| 2008/0106291 A1 | 5/2008 | Beaman et al. |
| 2008/0106872 A1 | 5/2008 | Beaman et al. |
| 2008/0111568 A1 | 5/2008 | Beaman et al. |
| 2008/0111569 A1 | 5/2008 | Beaman et al. |
| 2008/0111570 A1 | 5/2008 | Beaman et al. |
| 2008/0112144 A1 | 5/2008 | Beaman et al. |
| 2008/0112145 A1 | 5/2008 | Beaman et al. |
| 2008/0112146 A1 | 5/2008 | Beaman et al. |
| 2008/0112147 A1 | 5/2008 | Beaman et al. |
| 2008/0112148 A1 | 5/2008 | Beaman et al. |
| 2008/0112149 A1 | 5/2008 | Beaman et al. |
| 2008/0116912 A1 | 5/2008 | Beaman et al. |
| 2008/0116913 A1 | 5/2008 | Beaman et al. |
| 2008/0116914 A1 | 5/2008 | Beaman et al. |
| 2008/0116915 A1 | 5/2008 | Beaman et al. |
| 2008/0116916 A1 | 5/2008 | Beaman et al. |
| 2008/0117611 A1 | 5/2008 | Beaman et al. |
| 2008/0117612 A1 | 5/2008 | Beaman et al. |
| 2008/0117613 A1 | 5/2008 | Beaman et al. |
| 2008/0121879 A1 | 5/2008 | Beaman et al. |
| 2008/0123310 A1 | 5/2008 | Beaman et al. |
| 2008/0129319 A1 | 6/2008 | Beaman et al. |
| 2008/0129320 A1 | 6/2008 | Beaman et al. |
| 2008/0132094 A1 | 6/2008 | Beaman et al. |
| 2009/0026609 A1 | 1/2009 | Masuda |
| 2009/0085205 A1 | 4/2009 | Sugizaki |
| 2009/0128176 A1 | 5/2009 | Beaman et al. |
| 2009/0189288 A1 | 7/2009 | Beaman et al. |
| 2009/0236700 A1 | 9/2009 | Moriya |
| 2009/0315579 A1 | 12/2009 | Beaman et al. |
| 2010/0007009 A1 | 1/2010 | Chang et al. |
| 2010/0090330 A1 | 4/2010 | Nakazato |
| 2010/0224975 A1 | 9/2010 | Shin et al. |
| 2010/0232129 A1 | 9/2010 | Haba et al. |
| 2011/0068453 A1 | 3/2011 | Cho et al. |
| 2011/0140251 A1* | 6/2011 | Camacho ............... H01L 24/85 257/676 |
| 2011/0140259 A1 | 6/2011 | Cho et al. |

(56) References Cited

U.S. PATENT DOCUMENTS

| | | | |
|---|---|---|---|
| 2011/0241193 A1 | 10/2011 | Ding et al. | |
| 2012/0182706 A1* | 7/2012 | Siomkos | H01L 25/105 |
| | | | 361/803 |
| 2016/0111354 A1* | 4/2016 | Luan | H01L 23/49541 |
| | | | 257/675 |

FOREIGN PATENT DOCUMENTS

| | | | |
|---|---|---|---|
| JP | 2004047702 A | 2/2004 | |
| JP | 2004281514 A | 10/2004 | |
| JP | 2008251794 A | 10/2008 | |
| WO | 2006050691 A2 | 5/2006 | |

OTHER PUBLICATIONS

Partial International Search Report for Application No. PCT/US2012/060402 dated Feb. 21, 2013.
International Search Report and Written Opinion for Application No. PCT/US2012/060402 dated Apr. 2, 2013.
Partial International Search Report for Application No. PCT/US2013/026126 dated Jun. 17, 2013.
International Search Report and Written Opinion for Application No. PCT/US2013/026126 dated Jul. 25, 2013.

* cited by examiner

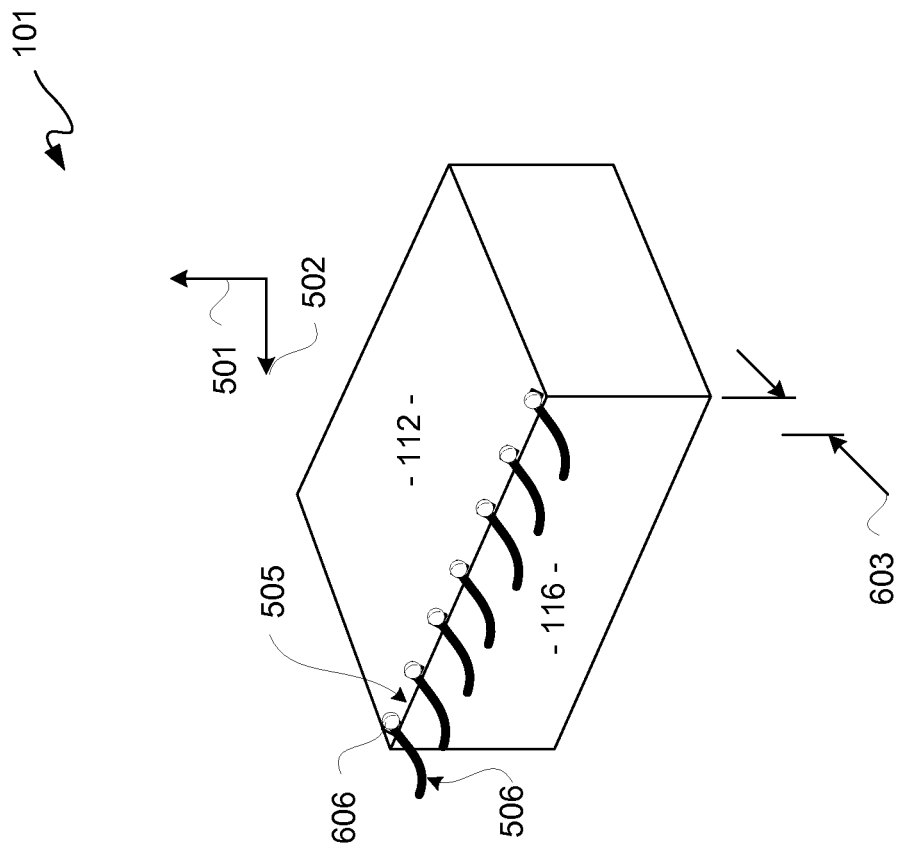
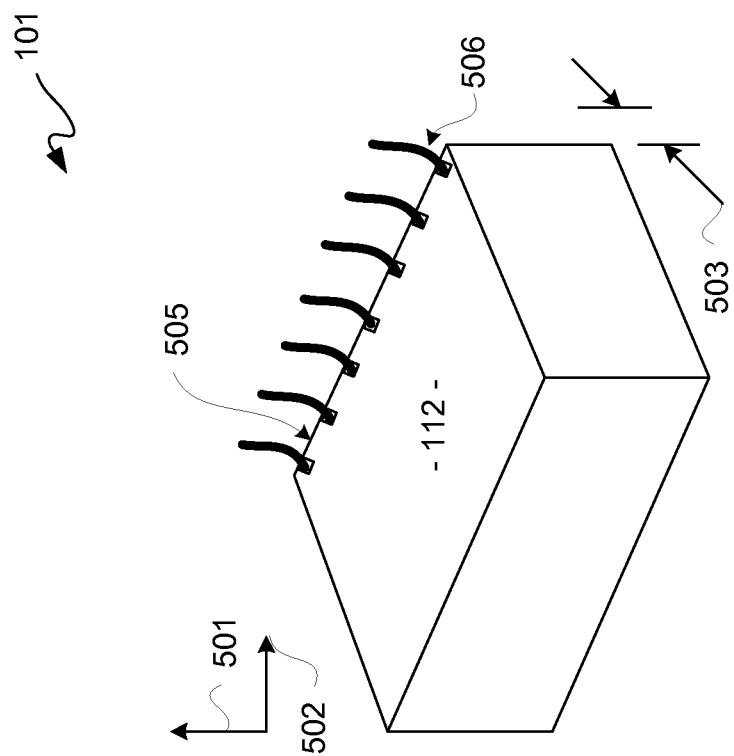
FIG. 6
FIG. 5

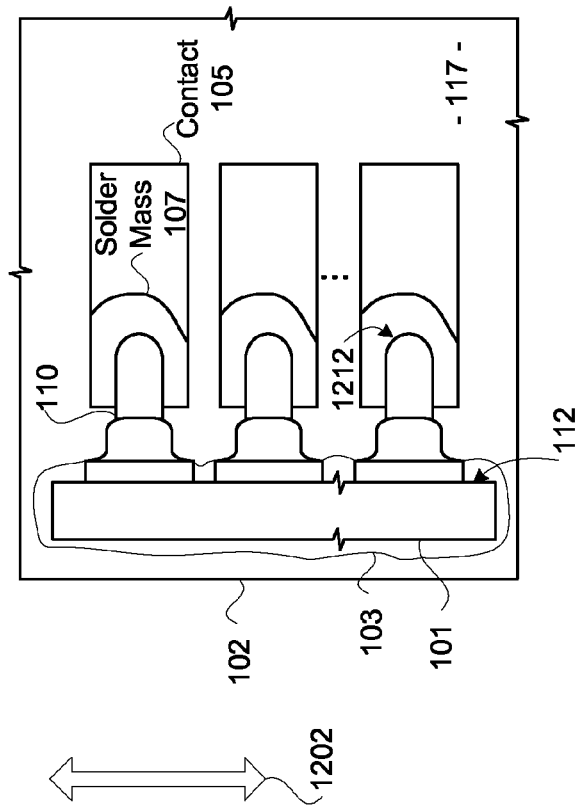
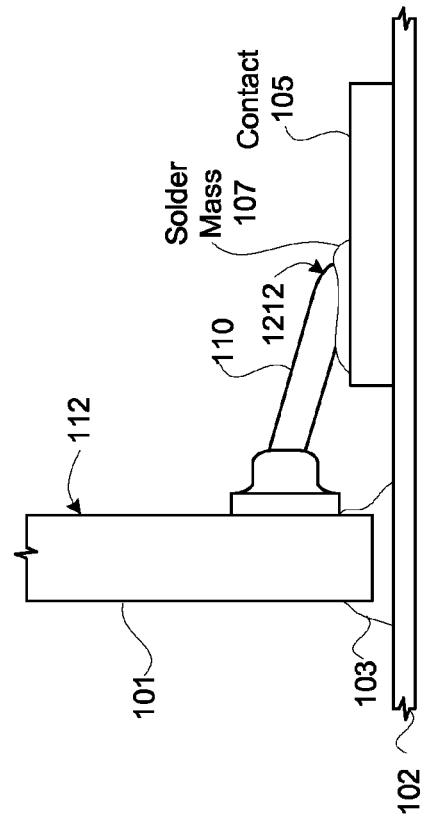
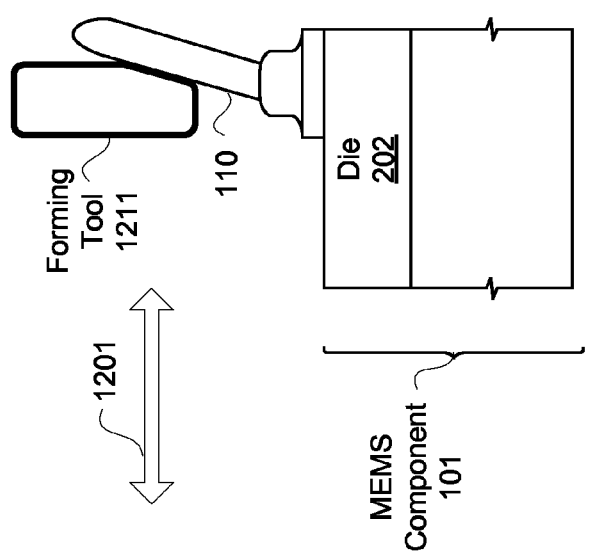

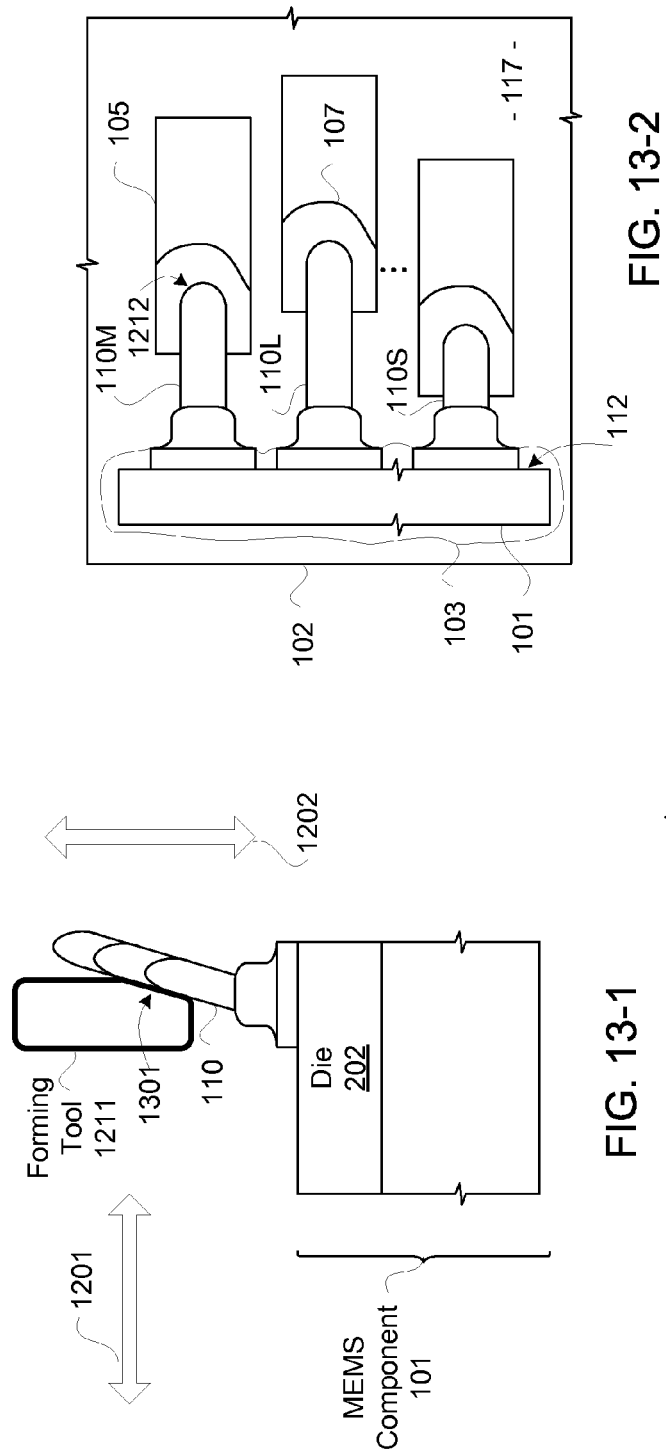
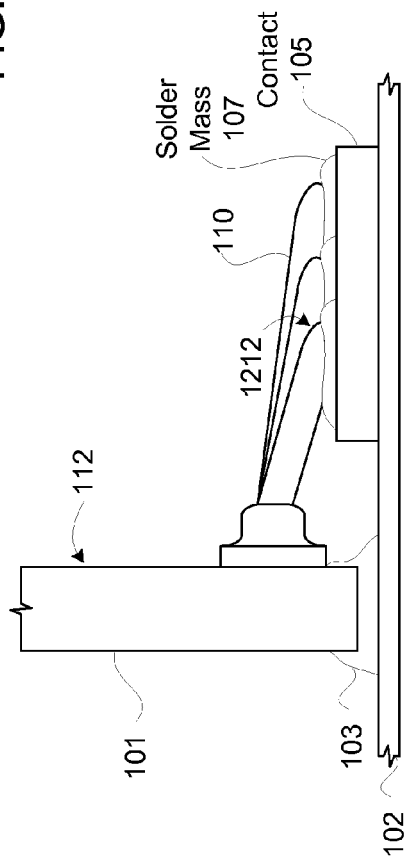

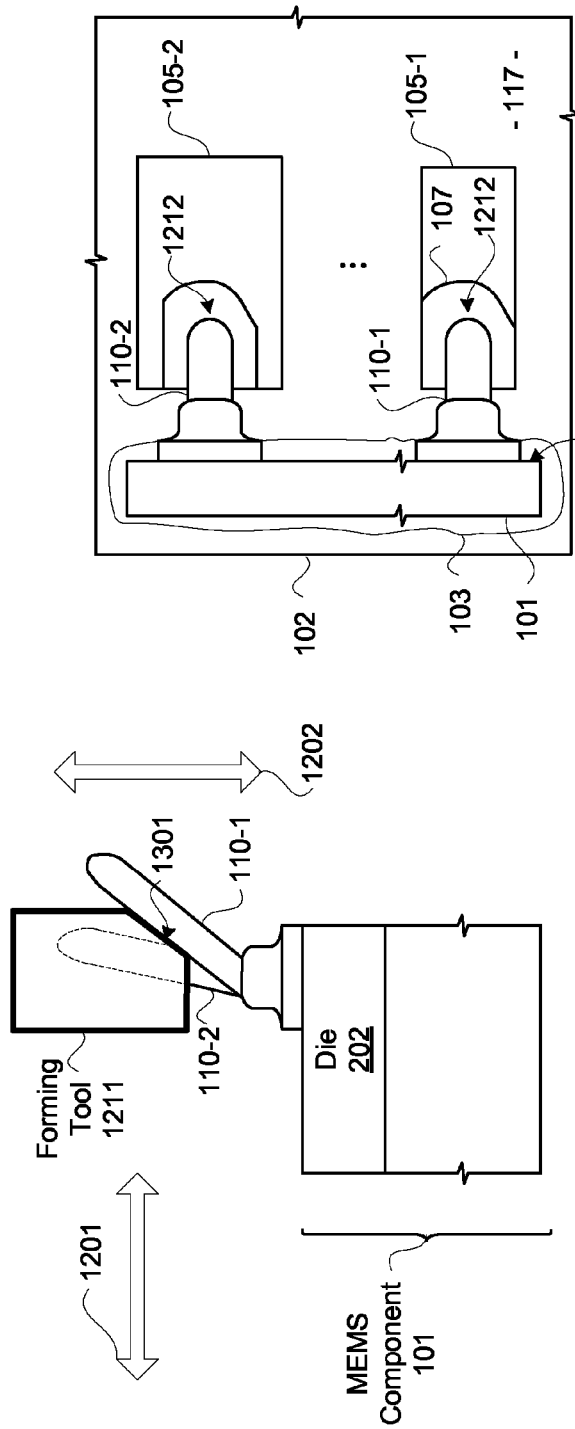
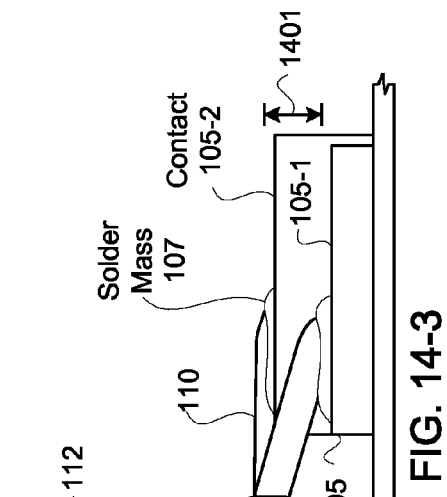
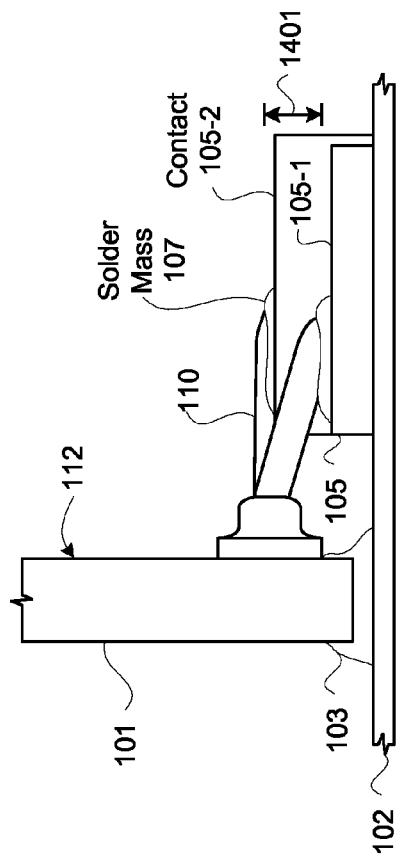
FIG. 14-1
FIG. 14-2
FIG. 14-3

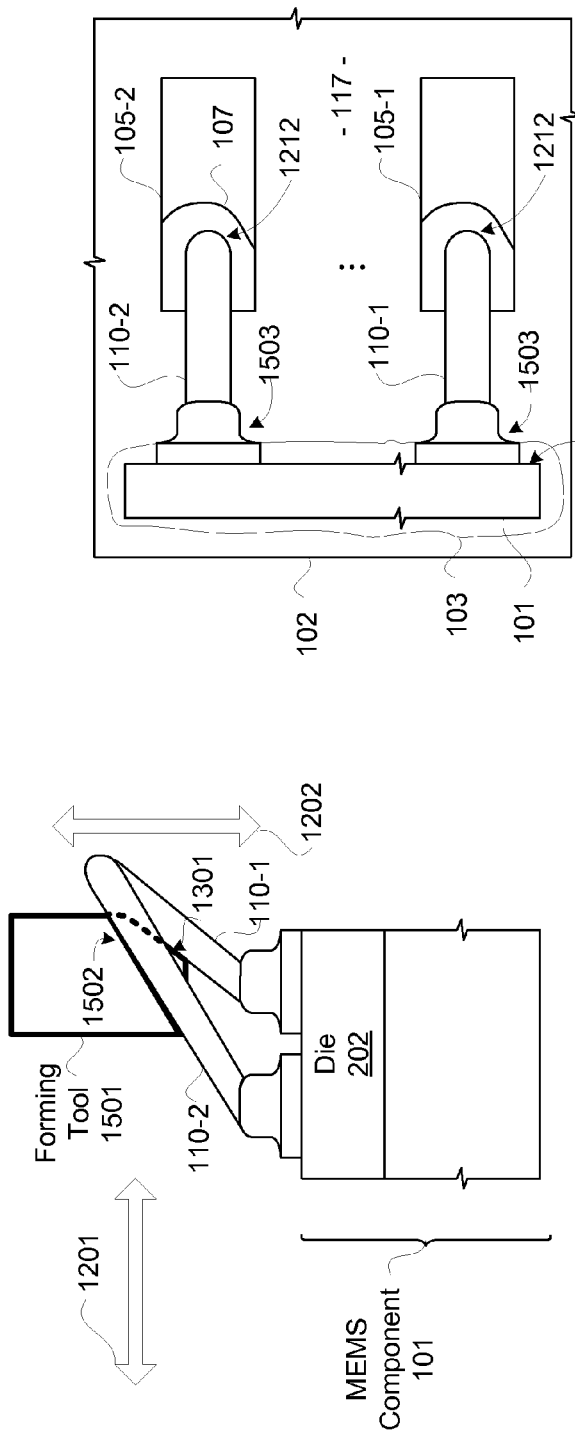
FIG. 15-1
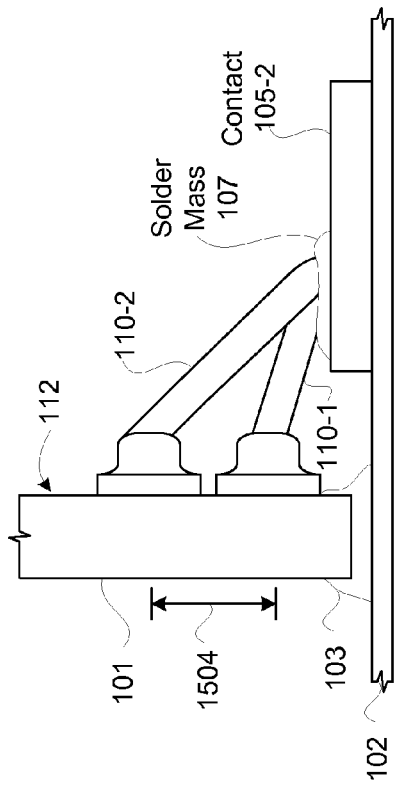
FIG. 15-2
FIG. 15-3

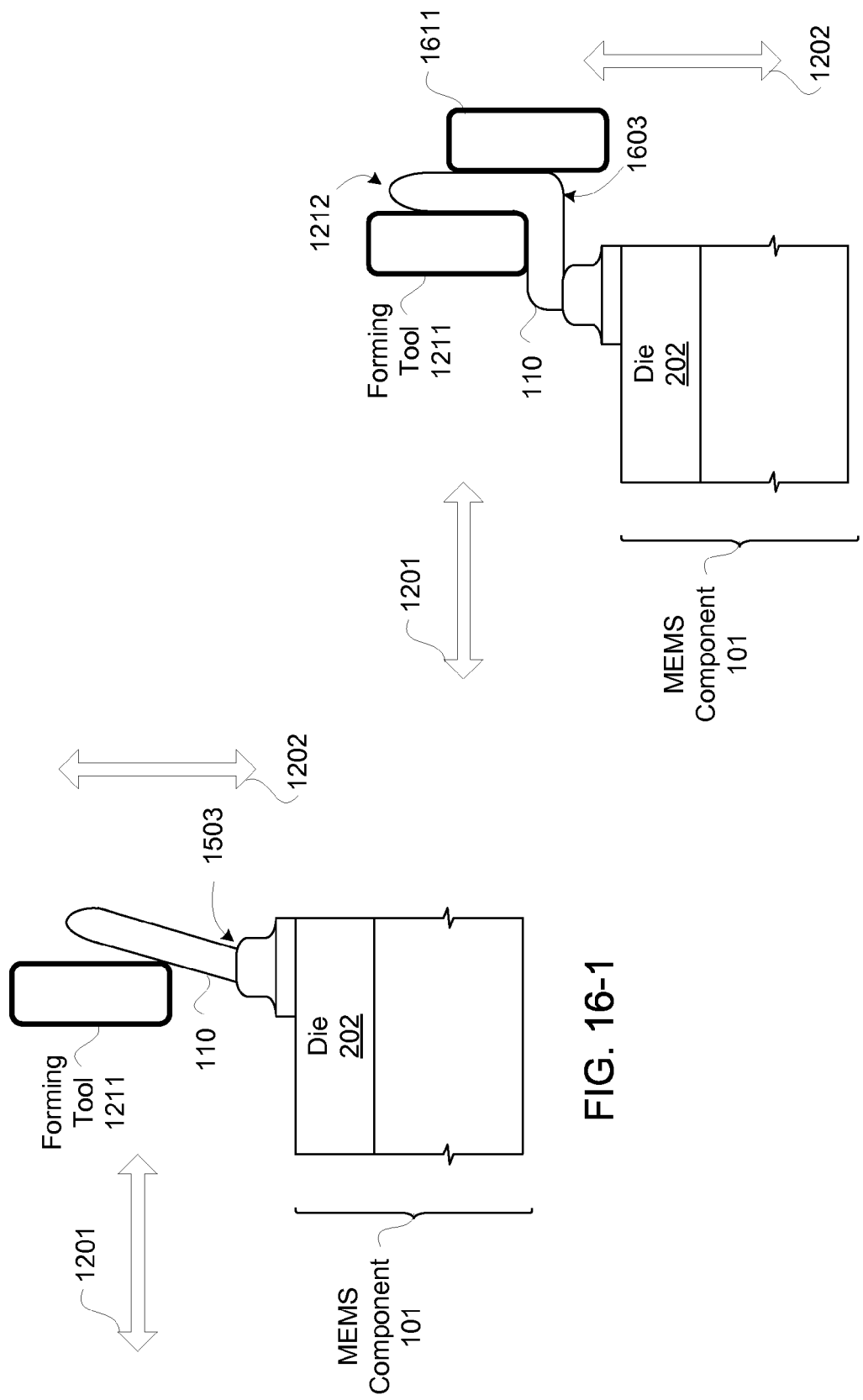

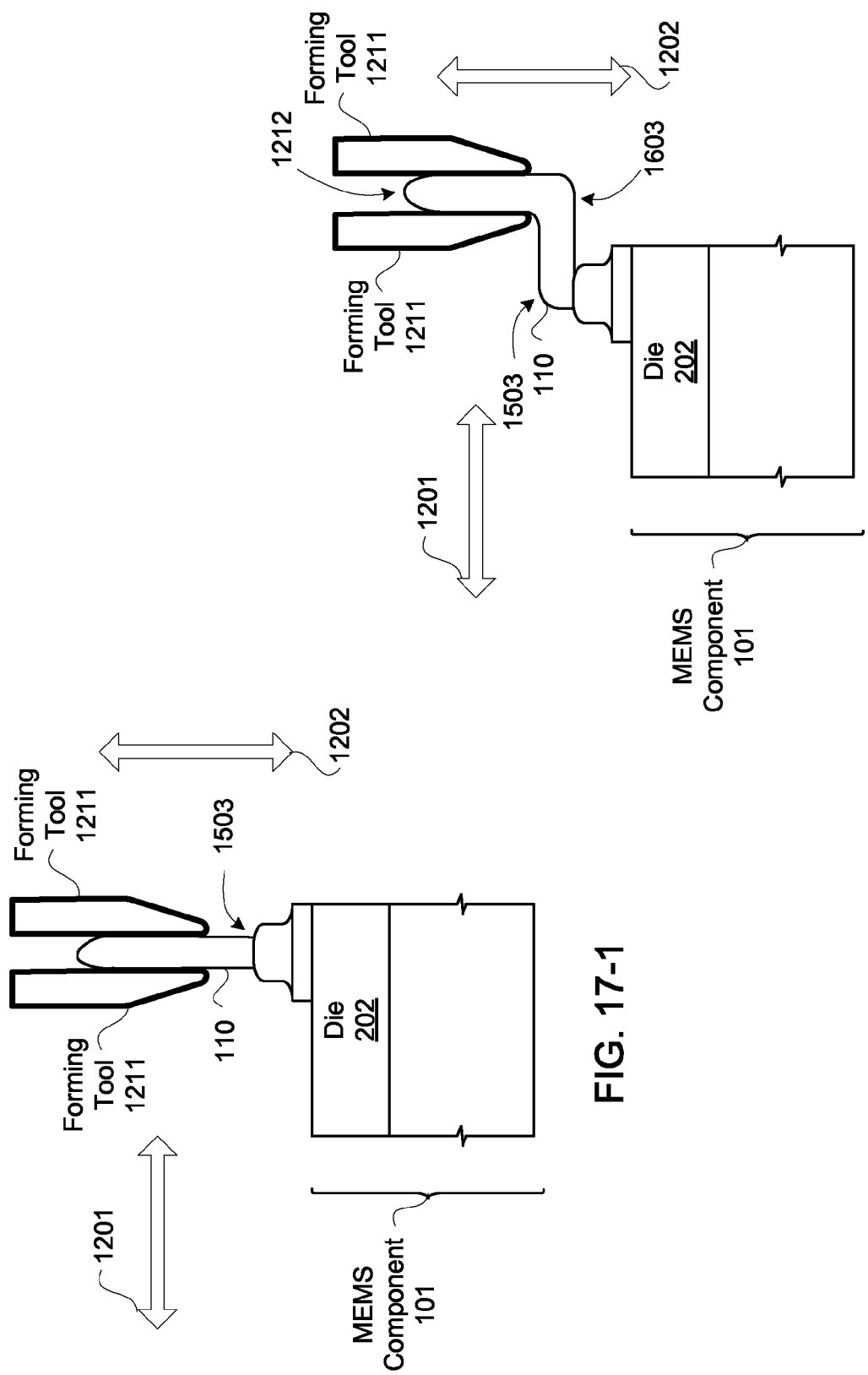

COUPLING OF SIDE SURFACE CONTACTS TO A CIRCUIT PLATFORM

FIELD

The following description relates to electronics, circuitry and packaging. More particularly, the following description relates to coupling of side surface contacts to a circuit platform.

BACKGROUND

Microelectronic assemblies generally include one or more ICs, such as for example one or more packaged dies ("chips"). One or more of such ICs may be mounted on a circuit platform, such as a wafer such as in wafer-level-packaging ("WLP"), printed board ("PB"), a printed wiring board ("PWB"), a printed circuit board ("PCB"), a printed wiring assembly ("PWA"), a printed circuit assembly ("PCA"), a package substrate, an interposer, a chip carrier, or other substrate. Microelectromechanical systems ("MEMS"; also referred to as micro systems technology ("MST") or "micromachines") conventionally incorporate nanotechnology with nanoelectromechanical systems ("NEMS"). MEMS components may be coupled to a circuit platform, along with other components, of a microelectronic assembly. Conventionally, a MEMS component has a large surface area to volume ratio, and so surface effects such as wetting, such as solder wetting for example, may be an issue with respect to coupling a MEMS component to a circuit platform.

Along those lines, a MEMS chip or component, such as for providing sensors for example, may have copper stud bumps on a side surface. Such copper stud bumps may be connected to a substrate, such as a PCB for example having copper bond pads, using solder shooting. Bond pad pitch may be fine, such as approximately a 130 micron pitch or less, and copper stud bumps may themselves be approximately 80 to 100 microns in width. Bottom edges of such copper stud bumps may be approximately 40 to 50 microns from a top surface of such PCB, and thickness of such copper bond pads may be approximately 50 microns on top of such top surface of such PCB. Thus, solder shooting may create unwanted solder bridging between bond pads and/or from a bond pad to a bottom die edge of an exposed active surface of a die of a MEMS chip.

To address such bridging, solder paste may be applied by screen printing, dispensing or other form of application. However, application of solder paste may narrow a die placement window. For example, a die of a MEMS chip may have to be placed very close to PCB bond pads to make one or more solder connections, and this placement may present solder bridging and/or wicking issues.

Accordingly, it would be desirable and useful to provide coupling of a MEMS component to a circuit platform which lessens likelihood, including without limitation avoids, one or more of the above-identified issues.

BRIEF SUMMARY

An apparatus relates generally to a microelectromechanical system component. In such an apparatus, the microelectromechanical system component has a lower surface, an upper surface, first side surfaces, and second side surfaces. Surface area of the first side surfaces is greater than surface area of the second side surfaces. The microelectromechanical system component has a plurality of wire bond wires attached to and extending away from a first side surface of the first side surfaces. The wire bond wires are self-supporting and cantilevered with respect to the first side surface of the first side surfaces.

A method relates generally to microelectromechanical system component. In such a method, obtained is the microelectromechanical system component having a lower surface, an upper surface, first side surfaces, and second side surfaces. Surface area of the first side surfaces is greater than surface area of the second side surfaces. A plurality of wire bond wires are attached to a first side surface of the first side surfaces of the microelectromechanical system component. The plurality of wire bond wires extend away from the first side surface of the first side surfaces. The wire bond wires are self-supporting and cantilevered with respect to the first side surface of the first side surfaces.

A system relates generally to a plurality of components coupled to a circuit platform. In such a system, each of the plurality of components has a lower surface, an upper surface, first side surfaces, and second side surfaces. Surface area of the first side surfaces is greater than surface area of the second side surfaces for each of the plurality of components. Each of the plurality of components has a plurality of wire bond wires attached to and extending downwardly away from a first side surface of the first side surfaces corresponding thereto. The plurality of wire bond wires forms an array. The plurality of wire bond wires for the plurality of components is self-supporting and cantilevered prior to being coupled to the circuit platform.

Other features will be recognized from consideration of the Detailed Description and Claims, which follow.

BRIEF DESCRIPTION OF THE DRAWING(S)

Accompanying drawing(s) show exemplary embodiment(s) in accordance with one or more aspects of exemplary apparatus(es) or method(s). However, the accompanying drawings should not be taken to limit the scope of the claims, but are for explanation and understanding only.

FIG. 5 is a projected view depicting an exemplary MEMS component, such as in FIG. 1.

FIG. 6 is a projected view depicting another exemplary MEMS component.

FIG. 12-1 is a block diagram of an enlarged partial side view depicting an exemplary MEMS component having a wire bond wire attached to a die of such MEMS component.

FIG. 12-2 is a block diagram of an enlarged partial top view depicting an exemplary MEMS component of FIG. 12-1 having wire bond wires attached to a vertical surface side surface of such MEMS component.

FIG. 12-3 is a block diagram of an enlarged partial side view depicting such an exemplary MEMS component of FIG. 12-2 having wire bond wires attached to a vertical surface side surface of such MEMS component.

FIG. 13-1 is a block diagram of an enlarged partial side view depicting another exemplary MEMS component having wire bond wires of different lengths attached to a die of such MEMS component.

FIG. 13-2 is a block diagram of an enlarged partial top view depicting an exemplary MEMS component of FIG. 13-1 having wire bond wires of different lengths attached to a vertical side surface of such MEMS component.

FIG. 13-3 is a block diagram of an enlarged partial side view depicting of such exemplary MEMS component of FIG. 13-2 having wire bond wires of different lengths attached to a vertical side surface of such MEMS component.

FIG. 14-1 is a block diagram of an enlarged partial side view depicting another exemplary MEMS component having wire bond wires of different heights in horizontal orientation with respect to one another attached to a die of such MEMS component.

FIG. 14-2 is a block diagram of an enlarged partial top view depicting an exemplary MEMS component of FIG. 14-1 having wire bond wires of different heights and generally a same length attached to a vertical side surface of such MEMS component.

FIG. 14-3 is a block diagram of an enlarged partial side view depicting of such exemplary MEMS component of FIG. 14-2 having wire bond wires of different heights attached to a vertical side surface of such MEMS component.

FIG. 15-1 is a block diagram of an enlarged partial side view depicting another exemplary MEMS component having wire bond wires of different heights in a vertical orientation with respect to one another attached to a die of such MEMS component.

FIG. 15-2 is a block diagram of an enlarged partial top view depicting an exemplary MEMS component of FIG. 15-1 having wire bond wires of different heights and lengths attached to a vertical side surface of such MEMS component.

FIG. 15-3 is a block diagram of an enlarged partial side view depicting of such exemplary MEMS component of FIG. 15-2 having wire bond wires of different heights attached to a vertical side surface of such MEMS component and/or wire bond wires of different heights at staggered bond pads attached to a vertical side surface of such MEMS component.

FIG. 16-1 is a block diagram of an enlarged partial side view depicting an exemplary MEMS component having a wire bond wire attached to a die of such MEMS component.

FIG. 16-2 is a block diagram of an enlarged partial side view depicting an exemplary MEMS component having a wire bond wire attached to a die of such MEMS component after compound bending with a first forming tool and a second forming tool.

FIG. 17-1 is a block diagram of an enlarged partial side view depicting an exemplary MEMS component having a wire bond wire attached to a die of such MEMS component.

FIG. 17-2 is a block diagram of an enlarged partial side view depicting an exemplary MEMS component having a wire bond wire attached to a die of such MEMS component after compound bending with forming tool.

DETAILED DESCRIPTION

In the following description, numerous specific details are set forth to provide a more thorough description of the specific examples described herein. It should be apparent, however, to one skilled in the art, that one or more other examples or variations of these examples may be practiced without all the specific details given below. In other instances, well known features have not been described in detail so as not to obscure the description of the examples herein. For ease of illustration, the same number labels are used in different diagrams to refer to the same items; however, in alternative examples the items may be different.

Figure 1:
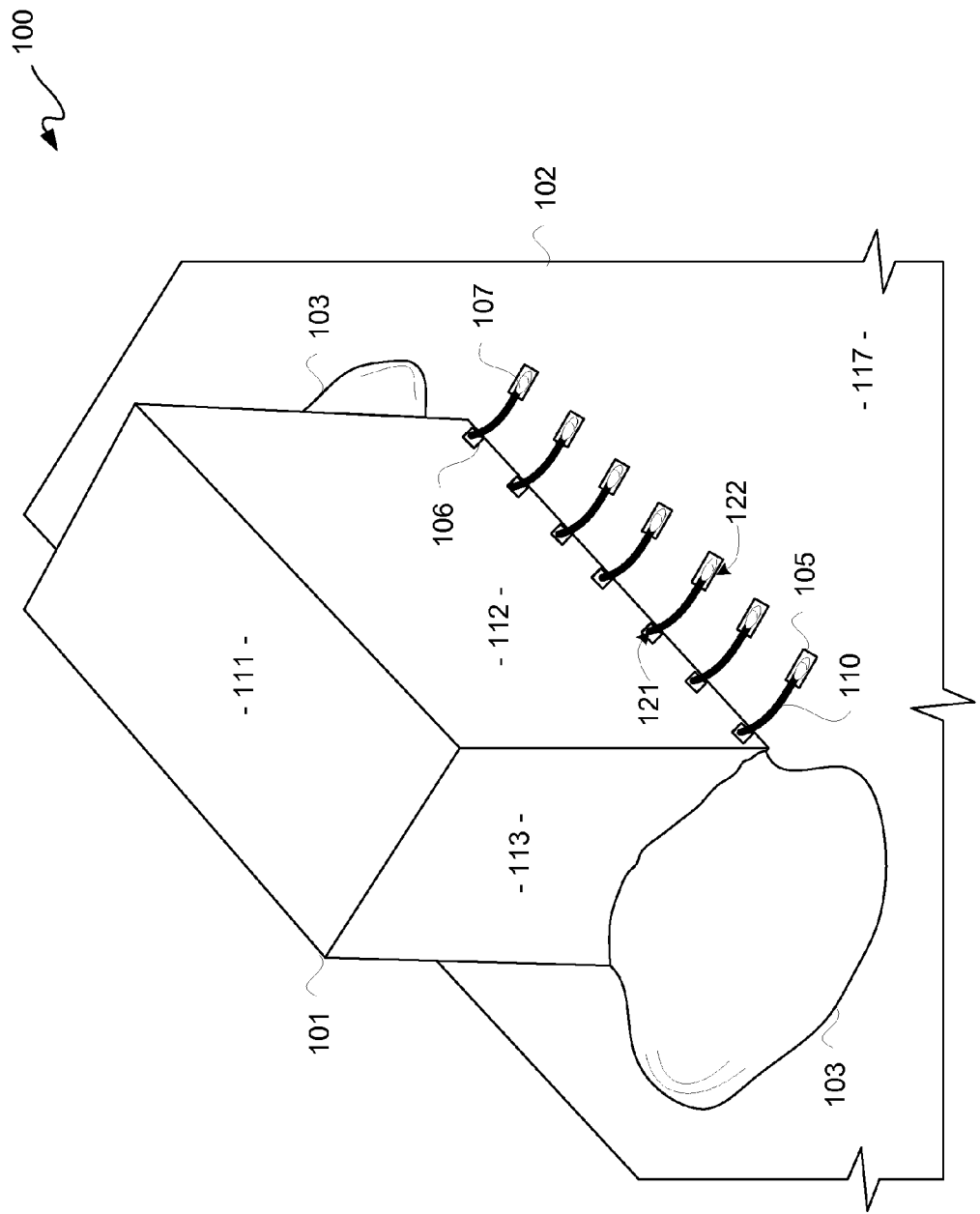
FIG. 1 is a projected partial or cut-away view depicting an exemplary microelectronic system.

With reference to FIG. 1, microelectronic system 100 may include a microelectronic system component 101 coupled to a circuit platform 102. Microelectronic system component 101 in this example may be a microelectromechanical system ("MEMS") component. However, in other implementations of a microelectronic systems 100, one or more other types of microelectronic system components having contacts along a side surface thereof may be used. In this example, circuit platform 102 may be a printed circuit board ("PCB") 102; however, in other implementations of microelectronic systems 100, other types of circuit platforms 102 may be used.

PCB 102 may have applied thereon solder paste to provide contacts 105. Such applied solder paste contacts 105 may be used for thermal compression bonding of ends of wire bond wires 110 and/or may be used for wetting for soldering of such ends of wire bond wires 110 for coupling to PCB 102. Optionally, contacts 105 may include or may be bond pads.

MEMS component 101 may have a lower surface 116 (shown in FIG. 2 for example), an upper surface 111, first side surfaces 112 and 114 (where side surface 114 is illustratively shown in FIG. 3) opposite one another, and second side surfaces 113 and 115 (where side surface 115 is illustratively shown in FIG. 2) opposite one another. Surface area of first side surfaces 112 and 114 may be greater than surface area of second side surfaces 113 and 115, collectively and respectively.

MEMS component 101 may have a plurality of wire bond wires 110 attached to and extending away from side surface 112. Prior to attachment to PCB 102, wire bond wires 110 may be self-supporting and cantilevered with respect to first side surface 112 after attachment to bond pads 106 of such side surface 112. Use of wire bond wires 110 may lessen likelihood, including without limitation to avoid, one or more of the above-identified issues associated with coupling of a MEMS component to a circuit platform.

PCB 102 may have a top surface 117 and an inner or a bottom surface 118 (where bottom surface 118 is illustratively shown in FIG. 10 for example) opposite of one another. Wire bond wires 110 may be attached to and extend away from side surface 112 for coupling to contacts 105, such as on a top surface 117 for example, of PCB 102. MEMS component 101 may be coupled to PCB 102 via wire bond wires 110.

MEMS component 101 may be coupled to PCB 102 with lower surface 116 facing top surface 117 for a vertical or perpendicular, including without limitation a generally perpendicular, orientation of MEMS component 101 to PCB 102. MEMS component 101 may be further coupled to PCB 102 with an epoxy or other adhesive 103. Masses of epoxy 103 may be attached to second side surfaces 113 and 115, respectively, and to top surface 117 for this attachment. Optionally, MEMS component 101 may be coupled to PCB 102 with a side surface 114 facing top surface 117 for a horizontal or parallel, including without limitation generally parallel, orientation of MEMS component 101 to PCB 102.

Proximal ends 121 of wire bond wires 110 may be thermal-compression bonded to bond pads 106 of side surface 112. Distal ends 122 of wire bond wires 110 may be solder bonded with solder balls or other solder masses 107 deposited over such distal ends 122 for attachment for electrical conductivity to contacts 105 of PCB 102. Optionally, distal ends 122 of wire bonds 110 may have free air balls (FABs) at tips thereof, and such FABs may be formed by electronic flame off. Optionally, distal ends 122 of wire bond wires 110 may be thermal-compression bonded to contacts 105 of PCB 102, such as illustratively depicted in FIG. 8.

Wire bond wires 110, which may be attached to and extend away from side surface 112, need not be partially or completely encapsulated by a molding material for structural support. Along those lines, wire bond wires 110, which may be attached to and extend away from side surface 112, may be completely external to MEMS component 101, including without limitation completely external to a molding material (not shown) of MEMS component 101.

Figure 2:
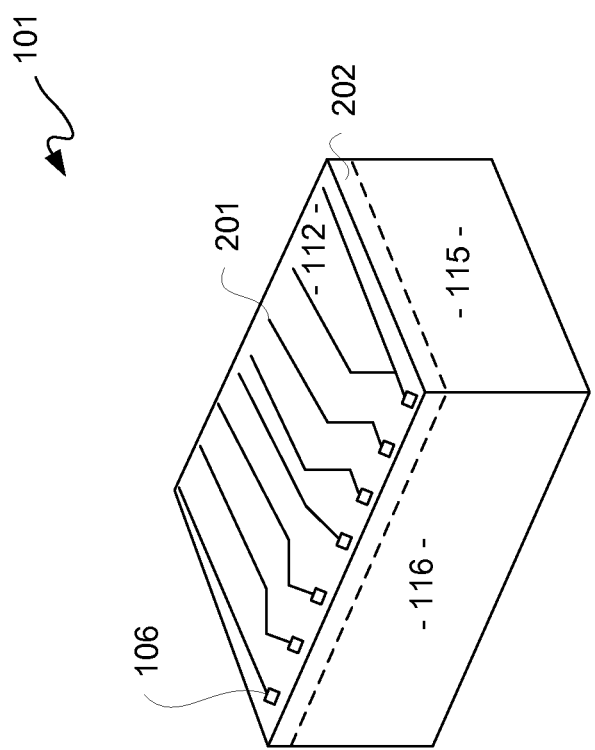
FIG. 2 is a projected view depicting an exemplary microelectromechanical systems ("MEMS") component.

With reference to FIG. 2, MEMS component 101, in this example implementation, has a side surface 112 which may be an exposed active surface of a die of MEMS component 101 having traces 201 interconnected to bond pads 106. However, in another example implementation, side surface 112 may not be an exposed active surface of a die 202 of MEMS component 101. For purposes of clarity by way of example and not limitation, it shall be assumed that side surface 112 is not an exposed active surface of a die 202.

Figure 3:
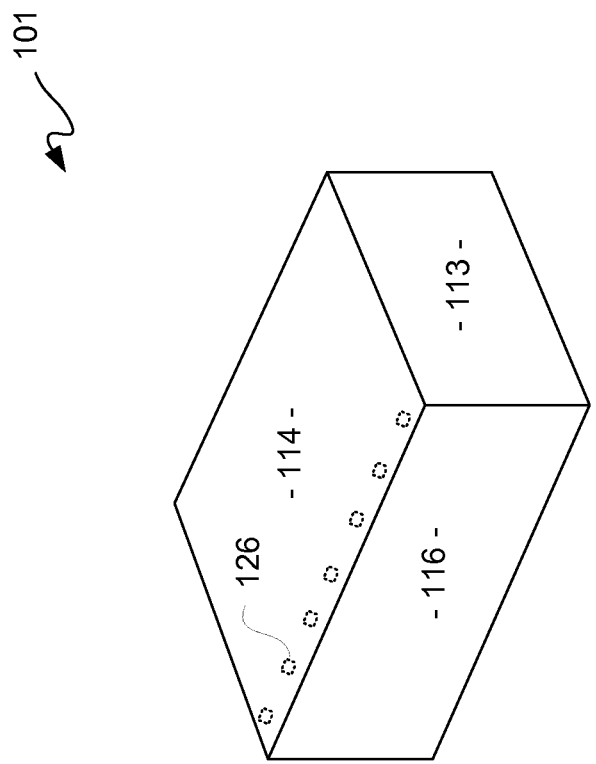
FIG. 3 is a projected view depicting the MEMS component of FIG. 2 or another exemplary MEMS component.

With reference to FIG. 3, MEMS component 101, in this example implementation, has a side surface 114 having optional bond pads 126. For purpose of clarity by way of example and not limitation, it shall be assumed that optional bond pads 126 are not present. Thus, for purposes of clarity by way of example and not limitation, it shall be assumed that wire bond wires 110 are only attached on side surface 112, or more particularly attached to bond pads 106 of side surface 112, namely on one side surface only of MEMS component 101.

Figure 4:
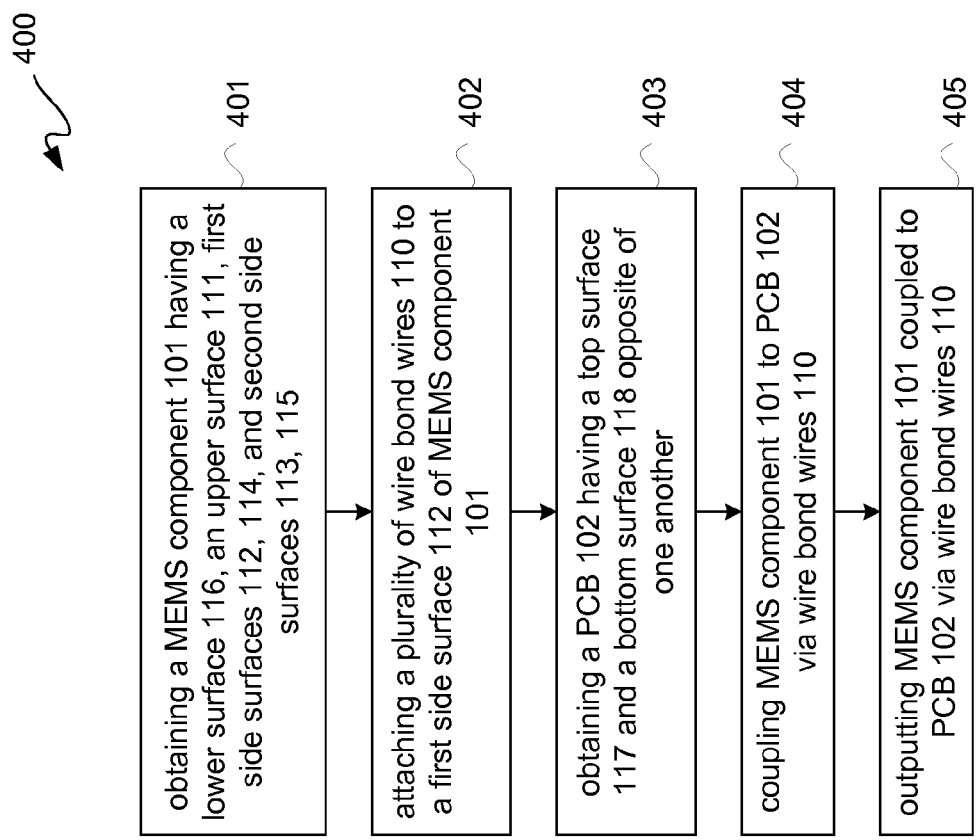
FIG. 4 is a flow diagram depicting an exemplary MEMS system assembly process.

Returning to FIG. 4, there is shown a flow diagram depicting an exemplary MEMS system assembly process 400. FIG. 5 is a projected view depicting an exemplary MEMS component 101, such as in FIG. 1. FIG. 6 is a projected view depicting another exemplary MEMS component 101. MEMS system assembly process 400 is further described with simultaneous reference to FIGS. 1 through 6.

At 401, a MEMS component 101 having a lower surface 116, an upper surface 111, first side surfaces 112, 114, and second side surfaces 113, 115 may be obtained. Surface area of first side surfaces 112, 114 may be greater than surface area of second side surfaces 113, 115, collectively and respectively.

At 402, a plurality of wire bond wires 110 may be attached to bond pads 106 of a first side surface 112 of MEMS component 101. In an implementation, thermal compression bonding of proximal ends 121 of wire bond wires 110 to bond pads 106 of first side surface 112 may be used for this attachment.

Wire bond wires 110 may extend away from side surface 112 in generally a vertical direction 501 with respect to a plane of side surface 112, namely generally perpendicular to side surface 112, as illustratively depicted in the example MEMS component 101 of FIG. 5. Additionally, such a plurality of wire bond wires 110 may have portions 503 thereof extend over lower edge 505 of side surface 112. Such a plurality of wire bond wires 110 may be attached to bond pads 106, such as with thermal compression bonds as illustratively depicted, and then such wire bond wires 110 may be bent, or drawn from a feed bond wire, to have arcs or bends 506 for this extension into such a generally vertical orientation before being severed from a feed wire. Techniques for forming may include those described elsewhere, for example, in U.S. Pat. Nos. 8,372,741 and 8,940,630 and U.S. patent application Ser. Nos. 14/077,597 and 14/297,701, which are all incorporated herein by reference in their entirety. Along those lines, wire bond wires 110 may be self-supporting and cantilevered with respect to MEMS component 101, and in particular with respect to side surface 112 thereof, at this juncture in MEMS system assembly process 400.

Optionally, wire bond wires 110 may extend away from side surface 112 in generally a horizontal direction 502 with respect to a plane of side surface 112, namely generally perpendicular to lower surface 116, as illustratively depicted in the example MEMS component 101 of FIG. 6. Additionally, such a plurality of wire bond wires 110 may have portions 603 thereof extend over lower edge 505 of side surface 112. Such a plurality of wire bond wires 110 may be attached to bond pads 106, such as with solder balls or masses 606 as illustratively depicted, and then such wire bond wires 110 may be bent or drawn to have arcs or bends 506 for this extension into such a generally horizontal orientation before being severed from a feed wire. Along those lines, wire bond wires 110 may be self-supporting and cantilevered with respect to MEMS component 101, and in particular with respect to side surface 112 thereof, at least at this juncture in MEMS system assembly process 400.

At 403, a PCB 102 having a top surface 117 and either an inner or a bottom surface 118 opposite of one another may be obtained. Having wire bond wires 110 attached to and extending away from side surface 112, wire bond wires 110 may be for coupling to PCB 102, such as with thermal compression bonding and/or bonding by soldering.

At 404, MEMS component 101 may be coupled to PCB 102 via bonding of wire bond wires 110. In an implementation, MEMS component 101 may be coupled to PCB 102 with a second surface 114 facing top surface 117 for a horizontal orientation of MEMS component 101 to PCB 102. In another implementation, MEMS component 101 may be coupled to PCB 102 with lower surface 116 facing top surface 117 for a vertical orientation of MEMS component 101 to PCB 102. At 405, MEMS component 101 coupled to PCB 102 via wire bond wires 110 may be output.

This coupling at 404 may include solder bonding distal ends 122 of wire bond wires 110 to PCB 102. This coupling at 404 may include thermal compression bonding distal ends 122 of wire bond wires 110 to PCB 102.

Figure 7:
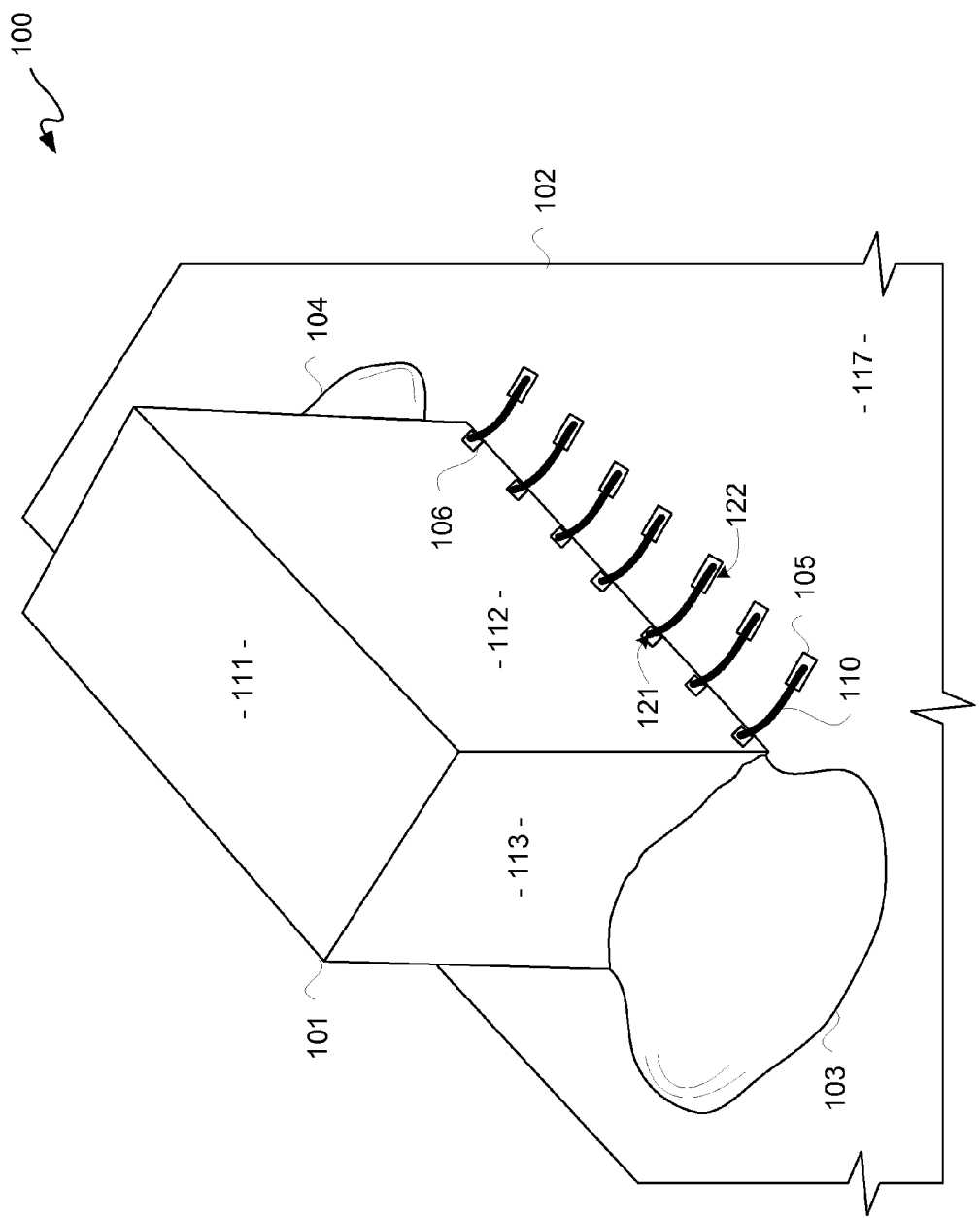
FIG. 7 is the projected partial or cut-away view depicting of FIG. 1 of microelectronic system 100, though with distal ends of wire bond wires thermally compression bonded for attachment for electrical conductivity to contacts of a circuit platform.

With reference to FIG. 7, microelectronic system 100 has distal ends 122 of wire bond wires 110 thermally compression bonded for attachment for electrical conductivity to contacts 105 of PCB 102. Again, side surface 112 may be an active surface of a die 202 of MEMS component 101.

Figure 8:
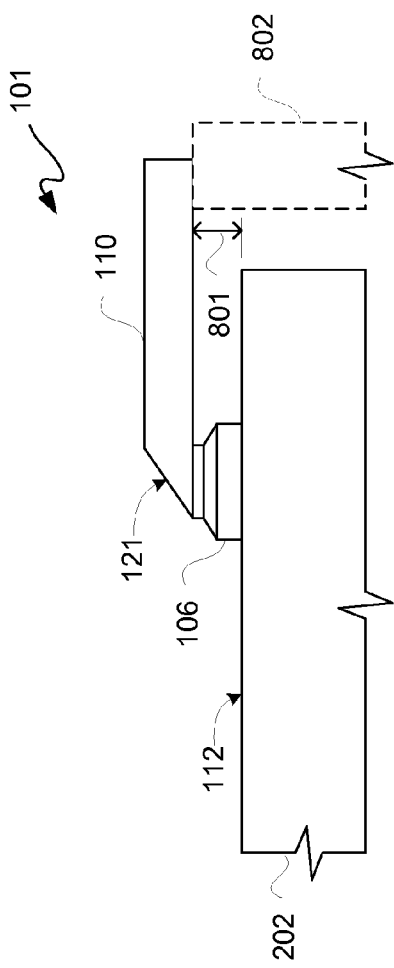
FIG. 8 is a block diagram of an enlarged partial side view of a MEMS component for an optional horizontal orientation.

FIG. 8 is a block diagram of an enlarged partial side view depicting a MEMS component 101, which may be for an optional horizontal placement. Optionally, MEMS component 101 may be in a generally horizontal orientation for coupling to vertical or elevated contacts 802 of a PCB 102 of FIG. 1 for example. However, again for purposes of clarity and not limitation, it shall be assumed that MEMS components 101 are for mounting in a vertical orientation to a PCB 102.

Figure 9:
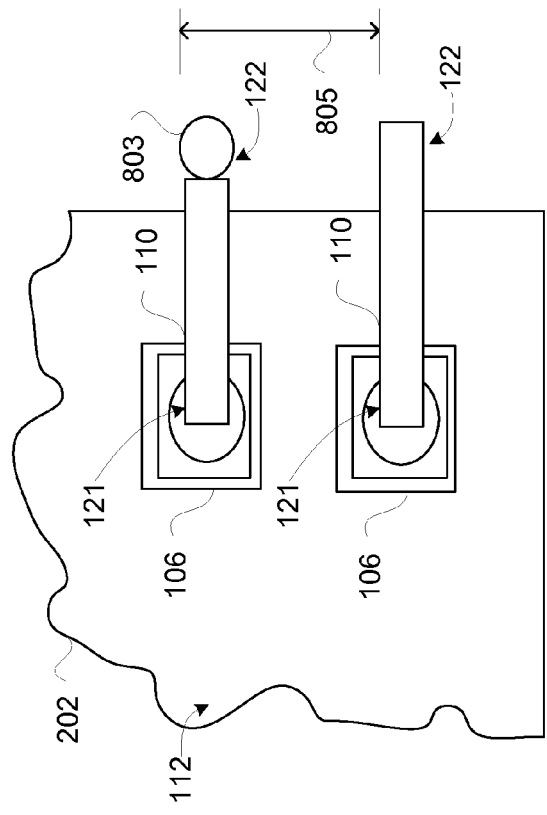
FIG. 9 is a block diagram of an enlarged partial top view of a MEMS component, such as of FIG. 8, illustratively depicting various configurations of distal ends of wire bond wires.

FIG. 9 is a block diagram of an enlarged partial top view of a MEMS component 101, such as of FIG. 8, though illustratively depicting various configurations of distal ends 122 of wire bond wires 110. With simultaneous reference to FIGS. 1-9, wire bond wires 110 are further described.

Proximal ends 121 may be attached to bases or bond pads 106, where such bond pads 106 are of or on a side surface 112, which side surface 112 may be of a die 202 to be vertically mounted, such as part of a MEMS component 101. Distance 801 between an underside of wire bond wires 110 and side surface 112 may be in a range of approximately 10 to 50 microns. Pitch 805 of wire bond wires 110 without free air balls ("FABs") or solder balls 803 at distal ends 122 of wire bond wires 110 may be in a range of approximately 50 to 200 microns. However, pitch 805 of wire bond wires 110 with FABs or solder balls 803 at distal ends 122 of wire bond wires 110 may likewise be in a range of approximately 50 to 200 microns.

Figure 11:
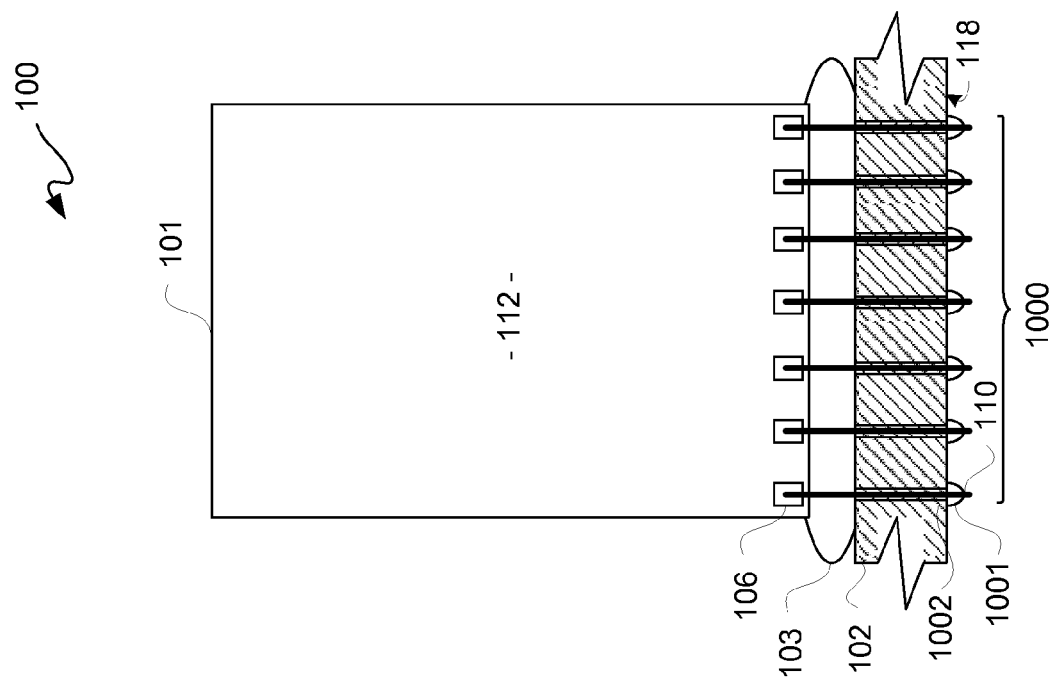
FIG. 11 is block diagram of a front facing cross-sectional partial view of the microelectronic system of FIG. 10.
Figure 10:
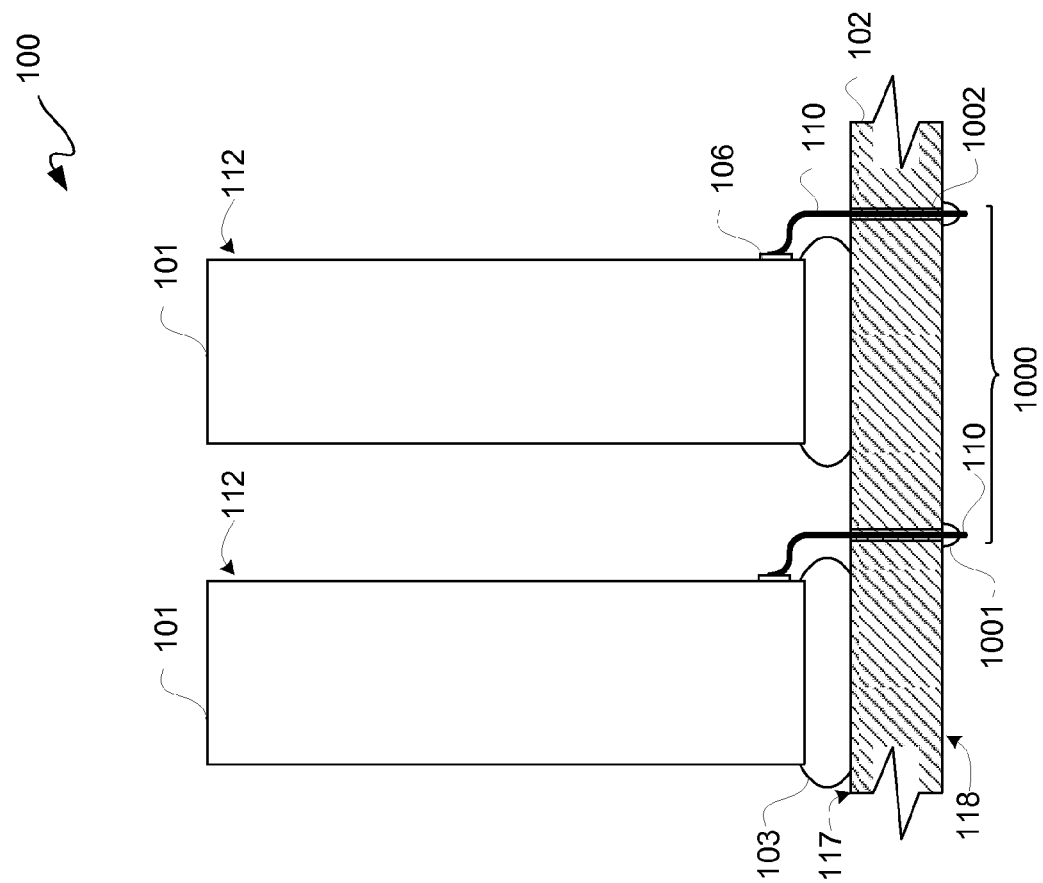
FIG. 10 is a block diagram of a side facing cross-sectional partial view of another microelectronic system.

FIG. 10 is block diagram of a side facing partial cross-sectional view of another MEMS system 100. FIG. 11 is a block diagram of a front facing partial cross-sectional view of the MEMS system 100 of FIG. 10. With simultaneous reference to FIGS. 1-11, MEMS system 100 of FIGS. 10 and 11 is further described.

MEMS components 101 may be generally vertically coupled to PCB 102 collectively forming an array 1000 of wire bond wires 110. Each of MEMS components 101 may have a lower surface 116, an upper surface 111, first side surfaces 112, 114, and second side surfaces 113, 115. Each of MEMS components 101 may have a plurality of wire bond wires 110 attached to and extending downwardly away from a first side surface 112 corresponding thereto. Each of wire bond wires 110 for each of MEMS components 101 may be self-supporting and cantilevered prior to being coupled to PCB 102. Each of MEMS components 101 may be coupled to PCB 102 with the lower surface 116 facing top surface 117 for at least a generally vertical orientation of each of MEMS components 101 to PCB 102. Wire bond wires 110 may be fed through vias 1002 extending between top surface 117 to an inner surface or bottom surface 118 of PCB 102. Distal ends 122 of wire bond wires 110 may be soldered, such as with flow solder bumps 1001, on an inner surface or bottom surface 118 of PCB 102.

FIG. 12-1 is a block diagram of an enlarged partial side view depicting an exemplary MEMS component 101 having a wire bond wire 110 attached to a die 202 of such MEMS component 101. FIG. 12-2 is a block diagram of an enlarged partial top view depicting an exemplary MEMS component 101 of FIG. 12-1 having wire bond wires 110 attached to a vertical surface side surface 112 of such MEMS component 101. FIG. 12-3 is a block diagram of an enlarged partial side view depicting such an exemplary MEMS component 101 of FIG. 12-2 having wire bond wires 110 attached to a vertical surface side surface 112 of such MEMS component 101. With simultaneous reference to FIGS. 12-1 through 12-3, coupling of MEMS component 101 to PCB 102 is further described.

A forming tool 1211 may be moved laterally 1201 and vertically 1202 for bending wire bond wires 110 into position. Wire bond wires 110 may be bent in advance of attachment of MEMS component 101 to PCB 102. MEMS component 101 may be attached to PCB 102 with epoxy 103. Distal ends 1212 of wire bond wires 110 may be attached to contacts 105, respectively, of PCB 102 with corresponding solder masses 107.

FIG. 13-1 is a block diagram of an enlarged partial side view depicting another exemplary MEMS component 101 having wire bond wires 110 of different lengths attached to a die 202 of such MEMS component 101. FIG. 13-2 is a block diagram of an enlarged partial top view depicting an exemplary MEMS component 101 of FIG. 13-1 having wire bond wires 110 of different lengths attached to a vertical side surface 112 of such MEMS component 101. FIG. 13-3 is a block diagram of an enlarged partial side view depicting of such exemplary MEMS component 101 of FIG. 13-2 having wire bond wires 110 of different lengths attached to a vertical side surface 112 of such MEMS component 101. With simultaneous reference to FIGS. 13-1 through 13-3, coupling of MEMS component 101 to PCB 102 is further described.

A forming tool 1211 may be moved laterally 1201 and vertically 1202 for bending wire bond wires 110 into position. Wire bond wires 110 may be bent in advance of attachment of MEMS component 101 to PCB 102. Forming tool 1211 may have an angled or beveled surface 1301 corresponding to a target angle or position to which wire bond wires 110 are bent.

Distal ends 1212 of wire bond wires 110 may be attached to contacts 105, respectively, of PCB 102 with corresponding solder masses 107. Distal ends 1212 are positioned further away from MEMS component 101 for long-length wire bond wires 110L than for medium-length wire bond wires 110M and short-length wire bond wires 110S. Distal ends 1212 of short-length wire bond wires 110S are closer to MEMS component 101 than those of medium-length wire bond wires 110M and long-length wire bond wires 110L.

MEMS component 101 may be attached to PCB 102 with epoxy 103 for a vertical orientation. Distal ends 1212 of wire bond wires 110 may be attached to contacts 105, respectively, of PCB 102 with corresponding solder masses 107, transverse with respect to vertical side surface 112 of MEMS component 101. Along those lines, contacts 105 may be for different components, and having different lengths for wire bond wires 110 may be useful for interconnecting MEMS component 101 to different components on PCB 102. For example, wire bond wires 110 may be 20 percent or more different in length from one another to provide distinctly different lengths.

FIG. 14-1 is a block diagram of an enlarged partial side view depicting another exemplary MEMS component 101 having wire bond wires 110 of different heights in horizontal orientation with respect to one another attached to a die 202 of such MEMS component 101. FIG. 14-2 is a block diagram of an enlarged partial top view depicting an exemplary MEMS component 101 of FIG. 14-1 having wire bond wires 110 of different heights and generally a same length attached to a vertical side surface 112 of such MEMS component 101. FIG. 14-3 is a block diagram of an enlarged partial side view depicting of such exemplary MEMS component 101 of FIG. 14-2 having wire bond wires 110 of different heights attached to a vertical side surface 112 of such MEMS component 101. With simultaneous reference to FIGS. 14-1 through 14-3, coupling of MEMS component 101 to PCB 102 is further described.

Wire bond wires 110-1 and 110-2 may be bent in advance of attachment of MEMS component 101 to PCB 102. A forming tool 1211 may be moved laterally 1201 and vertically 1202 for bending a wire bond wire 110-1 into position. Forming tool 1211 may have an angled or beveled surface 1301 corresponding to a target angle or position to which wire bond wire 110-1 is bent. Another wire bond wire 110-2, which may be a horizontally nearest neighbor of wire bond wire 110-1, may be bent with another forming tool (not shown) for a different bend angle than that provided with forming tool 1211. Optionally, wire bond wire 110-2 may not be bent at all, so as to remain generally perpendicular with respect to a vertical side surface 112. Furthermore, one or more other wire bond wires 110 may be located between wire bond wires 110-1 and 110-2.

Distal ends 1212 of wire bond wires 110-1 and 110-2 may be attached to contacts 105-1 and 105-2, respectively, of PCB 102 with corresponding solder masses 107. Distal ends 1212 are positioned at different heights with respect to MEMS component 101 or PCB 102. Distal ends 1212 of wire bond wires 110-1 and 110-2 may be at different heights 1401, namely spaced apart from one another in vertical direction, by having contacts 105-1 and 105-2, respectively, of different thicknesses for example. For example, contact 105-2 may be thicker than contact 105-1.

MEMS component 101 may be attached to PCB 102 with epoxy 103 for a vertical orientation. Distal ends 1212 of wire bond wires 110-1 and 110-2 may be attached to contacts 105-1 and 105-2, respectively, of PCB 102 with corresponding solder masses 107, transverse with respect to vertical side surface 112 of MEMS component 101. Along those lines, contacts 105-1 and 105-2 may be for different components, and having different heights for wire bond wires 110 may be useful for interconnecting MEMS component 101 to different components on PCB 102. For example, distal ends 1212 of wire bond wires 110 may be 20 percent or more different in height from one another to provide distinctly different heights.

Wire bond wires 110 may be horizontally disposed in a row along vertical side surface 112. Along those lines, wire bond wires 110 may be attached to and extend away from a side surface 112 to extend in a direction parallel, including without limitation generally parallel, to surface 117 and perpendicular, including without limitation generally perpendicular, to such side surface 112. As described below in additional detail, wire bond wires 110 may be vertically disposed in a column along vertical side surface 112. Again, in such column, wire bond wires 110 may be attached to and extend away from a side surface 112 to extend in a direction parallel, including without limitation generally parallel, to surface 117 and perpendicular, including without limitation generally perpendicular, to such side surface 112.

FIG. 15-1 is a block diagram of an enlarged partial side view depicting another exemplary MEMS component 101 having wire bond wires 110 of different heights in a vertical orientation with respect to one another attached to a die 202 of such MEMS component 101. FIG. 15-2 is a block diagram of an enlarged partial top view depicting an exemplary MEMS component 101 of FIG. 15-1 having wire bond wires 110 of different heights and lengths attached to a vertical side surface 112 of such MEMS component 101. FIG. 15-3 is a block diagram of an enlarged partial side view depicting of such exemplary MEMS component 101 of FIG. 15-2 having wire bond wires 110 of different heights attached to a vertical side surface 112 of such MEMS component 101 and/or wire bond wires 110 of different heights at staggered bond pads attached to a vertical side surface 112 of such MEMS component 101. With simultaneous reference to FIGS. 15-1 through 15-3, coupling of MEMS component 101 to PCB 102 is further described.

Wire bond wires 110-1 and 110-2 may be bent in advance of attachment of MEMS component 101 to PCB 102. A forming tool 1501 may be moved laterally 1201 and vertically 1202 for bending wire bond wires 110-1 and 110-2 into position. Forming tool 1501 may have an angled or beveled surface 1301 corresponding to a first target angle or position to which wire bond wire 110-1 is bent and may have an angled or beveled surface 1502 corresponding to a second target angle or position to which wire bond wire 110-2 is bent. Wire bond wire 110-2, which may be a vertically nearest neighbor of wire bond wire 110-1, may be bent at the same time as wire bond wire 110—with forming tool 1501. Furthermore, one or more other wire bond wires 110 may be located between wire bond wires 110-1 and 110-2.

Distal ends 1212 of wire bond wires 110-1 and 110-2 may be attached to contacts 105-1 and 105-2, respectively, of PCB 102 with corresponding solder masses 107. Distal ends 1212 are positioned at same heights with respect to MEMS component 101 or PCB 102; however, proximal ends 1503 of wire bond wires 110-1 and 110-2 may be at different heights, namely spaced apart 1504 from one another in a vertical direction as attached to vertical side surface 112. Distal ends 1212 of wire bond wires 110-1 and 110-2 may be at a same height, even though proximal ends 1503 are spaced apart from one another in vertical direction, by having contacts 105-1 and 105-2, respectively, of same thicknesses for example.

MEMS component 101 may be attached to PCB 102 with epoxy 103 for a vertical orientation. Distal ends 1212 of wire bond wires 110-1 and 110-2 may be attached to contacts 105-1 and 105-2, respectively, of PCB 102 with corresponding solder masses 107, transverse with respect to vertical side surface 112 of MEMS component 101. Along those lines, contacts 105-1 and 105-2 may be for different components, and having different heights for wire bond wires 110 as attached to vertical side surface 112 may be useful for interconnecting MEMS component 101 to different components on PCB 102.

FIG. 16-1 is a block diagram of an enlarged partial side view depicting an exemplary MEMS component 101 having a wire bond wire 110 attached to a die 202 of such MEMS component 101. A first forming tool 1211 may be moved laterally 1201 and vertically 1202 for bending wire bond wires 110 into position. Wire bond wires 110 may be bent in advance of attachment of MEMS component 101 to PCB 102. Wire bond wire 110 is bent at a proximal end 1503 using a first forming tool 1211.

FIG. 16-2 is a block diagram of an enlarged partial side view depicting an exemplary MEMS component 101 having a wire bond wire 110 attached to a die 202 of such MEMS component 101 after compound bending with a first forming tool 1211 and a second forming tool 1611. With first forming tool 1211 positioned in contact with wire bond wire 110, a second forming tool 1611 may be moved laterally 1201 and vertically 1202 for bending wire bond wires 110 into position for a compound bend. Second forming tool 1611 may be positioned on an opposite side of wire bond wire 110 with respect to first forming tool 1211 for a bend 1603, where bend 1603 is between proximal end 1503 and distal end 1212. Accordingly, wire bond wire 110 may have a double or compound bend, namely a proximal bend 1503 and a medial bend 1603. The first forming tool 1211 and the second forming tool 1611 may be integrated into a single tool with opposing surfaces for forming the desired bend in wire 110.

FIG. 17-1 is a block diagram of an enlarged partial side view depicting an exemplary MEMS component 101 having a wire bond wire 110 attached to a die 202 of such MEMS component 101. A forming tool 1211 may be moved laterally 1201 and vertically 1202 for bending wire bond wires 110 into position. Wire bond wires 110 may be bent in advance of attachment of MEMS component 101 to PCB 102. Wire bond wire 110 may be bent at a proximal end 1503 using forming tool 1211, as described below in additional detail.

FIG. 17-2 is a block diagram of an enlarged partial side view depicting an exemplary MEMS component 101 having a wire bond wire 110 attached to a die 202 of such MEMS component 101 after compound bending with forming tool 1211. With a distal end of forming tool 1211 positioned in contact with a proximal end 1503 of wire bond wire 110, a bend may be made in wire bond wire 110 at a proximal end 1503, namely a proximal bend 1503.

Forming tool 1211 may be moved laterally 1201 and vertically 1202 to be repositioned for bending wire bond wire 110 for a compound bend. A distal end of forming tool 1211 may be positioned to a medial region of wire bond wire 110. Wire bond wire 110 may be bent with forming tool 1211 for a bend 1603, where bend 1603 is between proximal end 1503 and distal end 1212 of wire bond wire 110. Accordingly, wire bond wire 110 may have a double or compound bend, namely a proximal bend 1503 and a medial bend 1603.

Figure 18:
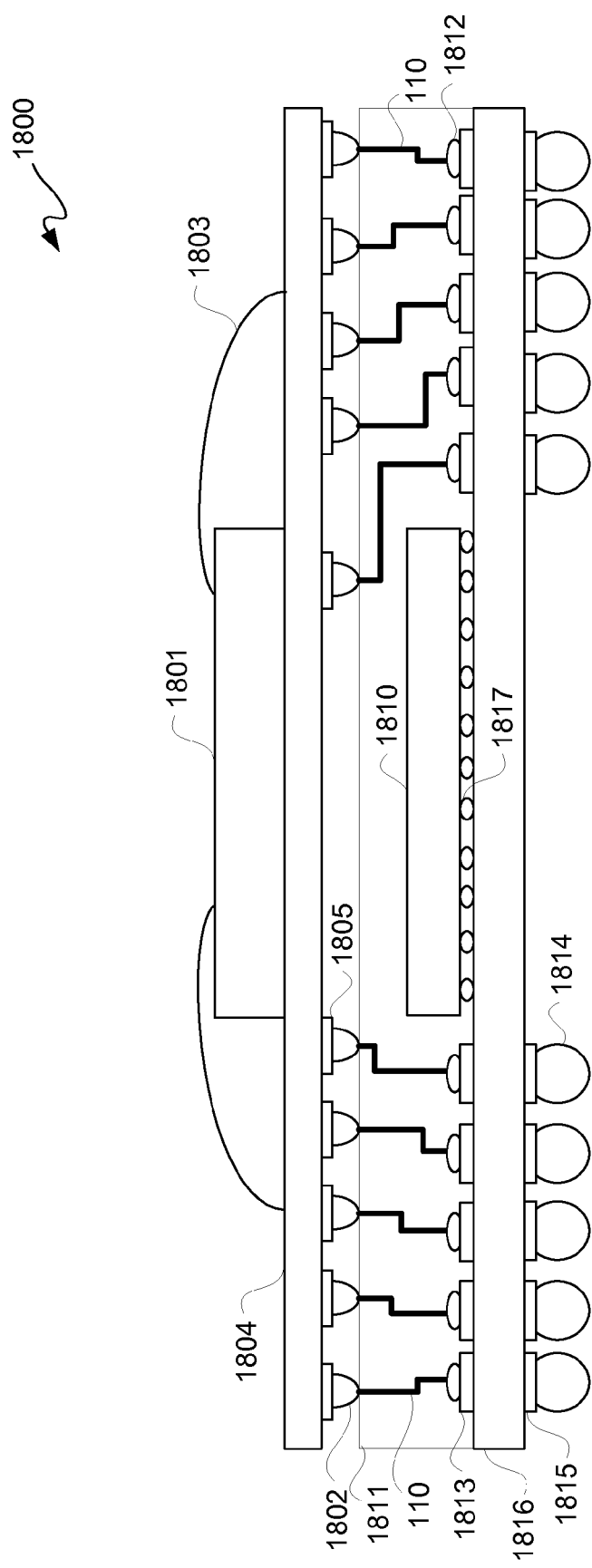
FIG. 18 is a block diagram of a side cross-sectional view of a microelectronic component.

FIG. 18 is a block diagram of a side cross-sectional view of a microelectronic component 1800. Along those lines, compound bends in wire bond wires 110 are not limited to MEMS components. In this example, a memory die 1801 is attached to an upper substrate 1804. Wire bonds 1803 may be used to interconnect an upper surface of memory die 1801 to an upper surface of upper substrate 1804, as is known. As is known, upper substrate 1804 may have pads 1805 disposed along a lower surface of upper substrate 1804 for receiver solder masses 1802.

Solder masses 1802 may be used for physically and electrically coupling distal ends of wire bond wires 110 with compound bends to pads 1805 along a lower surface of upper substrate 1804. Proximal ends of wire bond wires 110 may be coupled to pads 1813 along an upper surface of lower substrate 1816 with solder masses 1812. A molding layer 1811 may be used to seal at least portions of wire bond wires 110 therein.

A logic integrated circuit die 1810, such as a processor or known logic integrated circuit die 1810, may be coupled to an upper surface of lower substrate 1816 with microbumps 1817. Pads 1815 along a lower surface of lower substrate 1816 may have attached thereto corresponding solder balls 1814.

While the foregoing describes exemplary embodiment(s) in accordance with one or more aspects of the invention, other and further embodiment(s) in accordance with the one or more aspects of the invention may be devised without departing from the scope thereof, which is determined by the claim(s) that follow and equivalents thereof. Claim(s) listing steps do not imply any order of the steps. Trademarks are the property of their respective owners.

What is claimed is:

1. An apparatus, comprising:
a microelectromechanical system component having a lower surface, an upper surface, first side surfaces, and second side surfaces;
wherein surface area of the first side surfaces is greater than surface area of the second side surfaces;
the microelectromechanical system component having a plurality of wire bond wires attached to and extending away from a first side surface of the first side surfaces;
the plurality of wire bond wires having attached thereto solder balls at distal ends of the plurality of wire bond wires with respect the first side surface; and
wherein the wire bond wires are self-supporting and cantilevered with respect to the first side surface of the first side surfaces with the solder balls attached thereto.

2. The apparatus according to claim 1, wherein the plurality of wire bond wires are attached to and extend away from the first side surface in a direction generally perpendicular to the first side surface in a row on the first side surface.

3. The apparatus according to claim 1, wherein the plurality of wire bond wires are attached to and extend away from the first side surface in a direction generally perpendicular to the first side surface in a column on the first side surface.

4. The apparatus according to claim 1, wherein the plurality of wire bond wires attached to and extending away from the first side surface have compound bends.

5. A method, comprising:
obtaining a microelectromechanical system component having a lower surface, an upper surface, first side surfaces, and second side surfaces;
wherein surface area of the first side surfaces is greater than surface area of the second side surfaces;
attaching a plurality of wire bond wires to a first side surface of the first side surfaces of the microelectromechanical system component;
wherein the plurality of wire bond wires extend away from the first side surface of the first side surfaces;
attaching solder balls at distal ends of the plurality of wire bond wires with respect the first side surface; and
wherein the wire bond wires are self-supporting and cantilevered with respect to the first side surface of the first side surfaces and with the solder balls attached thereto.

6. The method according to claim 5, further comprising:
obtaining a circuit platform having a top surface and a bottom surface opposite of one another; and
coupling the microelectromechanical system component to the circuit platform via the plurality of wire bond wires.

7. The method according to claim 6, wherein the microelectromechanical system component is coupled to the circuit platform with a second surface of the first side surfaces facing the top surface for a horizontal orientation of the microelectromechanical system component to the circuit platform.

8. The method according to claim 6, wherein the microelectromechanical system component is coupled to the circuit platform with the lower surface facing the top surface for a vertical orientation of the microelectromechanical system component to the circuit platform.

9. The method according to claim 6, wherein the attaching comprises thermal compression bonding proximal ends of the plurality of wire bond wires to bond pads of the first side surface.

10. The method according to claim 9, wherein the coupling comprises solder bonding distal ends of the plurality of wire bond wires to the circuit platform.

11. The method according to claim 9, wherein the coupling comprises thermal compression bonding distal ends of the plurality of wire bond wires to the circuit platform.

12. The method according to claim 5, wherein the first side surface of the first side surfaces is an active surface of a die of the microelectromechanical system component.

13. A system, comprising:
a circuit platform;
a plurality of components coupled to the circuit platform;
wherein each of the plurality of components has a lower surface, an upper surface, first side surfaces, and second side surfaces;
wherein surface area of the first side surfaces is greater than surface area of the second side surfaces for each of the plurality of components;
each of the plurality of components having a plurality of wire bond wires attached to and extending downwardly away from a first side surface of the first side surfaces corresponding thereto;
the plurality of wire bond wires having attached thereto solder balls at distal ends of the plurality of wire bond wires with respect the first side surface;
wherein the plurality of wire bond wires forms an array; and
wherein the plurality of wire bond wires for the plurality of components is self-supporting and cantilevered with the solder balls attached thereto prior to being coupled to the circuit platform.

* * * * *